(12) United States Patent
Kang

(10) Patent No.: US 7,283,388 B2
(45) Date of Patent: Oct. 16, 2007

(54) MEMORY DEVICE USING MULTIPLE LAYER NANO TUBE CELL

(75) Inventor: Hee Bok Kang, Daejeongwangyeok-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 52 days.

(21) Appl. No.: 11/058,184

(22) Filed: Feb. 16, 2005

(65) Prior Publication Data

US 2005/0180193 A1    Aug. 18, 2005

(30) Foreign Application Priority Data

Feb. 16, 2004   (KR) ............... 10-2004-0010038

(51) Int. Cl.
*G11C 11/36*   (2006.01)
(52) U.S. Cl. ............ 365/175; 365/149; 365/230.06
(58) Field of Classification Search .......... 365/175, 365/149, 230.06
See application file for complete search history.

(56) References Cited

U.S. PATENT DOCUMENTS

| 4,066,915 | A |   | 1/1978  | Ohhinata |
| 4,677,455 | A |   | 6/1987  | Okajima |
| 4,882,706 | A |   | 11/1989 | Sinclair |
| 5,959,878 | A |   | 9/1999  | Kamp ................... 365/117 |
| 6,097,627 | A | * | 8/2000  | Peterson et al. ......... 365/175 |
| 6,229,161 | B1 |  | 5/2001  | Nemati et al. |
| 6,501,111 | B1 |  | 12/2002 | Lowrey ................. 257/295 |
| 6,824,908 | B2 |  | 11/2004 | Yamaura et al. |
| 6,930,906 | B2 |  | 8/2005  | Matsushita et al. ...... 365/145 |
| 2002/0006539 | A1 | | 1/2002 | Kubota et al. |
| 2004/0234841 | A1 | | 11/2004 | Yoshitake et al. |
| 2005/0040048 | A1 | | 2/2005 | Kim et al. |

FOREIGN PATENT DOCUMENTS

JP        6-163846 A        6/1994

* cited by examiner

*Primary Examiner*—David Lam
(74) *Attorney, Agent, or Firm*—Townsend and Townsend and Crew LLP

(57) ABSTRACT

A memory device features a multiple layer nano tube cell. In the memory device, a cross point cell array including a capacitor and a PNPN nano tube switch is effectively arranged to reduce the whole memory size. Also, in the memory device, the nano tube cell array including a capacitor and a PNPN nano tube switch which does not require an additional gate control signal is positioned on a circuit device region including a word line driving unit, a sense amplifier, a data bus, a main amplifier, a data buffer and an input/output port, and an interlayer insulating film is interposed between a cell array region and the circuit device region.

14 Claims, 17 Drawing Sheets

MEMORY DEVICE USING MULTIPLE LAYER NANO TUBE CELL

BACKGROUND OF THE INVENTION

1. Field of the Invention

The present invention generally relates to a memory device using a multiple layer nano tube cell, and more specifically, to a technology of effectively arranging a cross point cell array comprising a capacitor and a PNPN nano tube switch which does not require a gate control signal, thereby reducing whole memory size.

2. Description of the Prior Art

Generally, a Dynamic Random Access Memory (hereinafter, referred to as 'DRAM') comprises a transistor for performing a switching operation depending on a state of a word line to connect a capacitor to a bit line, and the capacitor connected between a plate line and one terminal of the transistor.

Here, a switching device of a conventional DRAM cell is a NMOS transistor whose switching operation is controlled by a gate control signal. However, when a cell array is embodied by using the NMOS transistor as a switching device, the whole chip size is increased.

Meanwhile, a refresh characteristic of the DRAM cell is determined by the leakage current characteristic of the NMOS transistor. When the channel length of the NMOS transistor is decreased to a nanometer (1/1 billion) scale, short channel leakage current increases more by the current characteristic of a sub threshold voltage (Sub Vt) of the NMOS transistor. As a result, it is difficult to satisfy the refresh characteristic of the DRAM cell. Also, junction leakage current is generated in a storage node terminal which occupies a relatively large area in the DRAM cell.

Therefore, it is necessary to embody a cross point cell using a capacitor and a PNPN nano tube switch which does not require an additional gate control signal, and to reduce the whole chip size by effectively positioning the cross point cell and a circuit device region for controlling the same.

SUMMARY OF THE INVENTION

It is an object of the present invention to reduce the whole size of a memory by positioning a nano tube cell array on an interlayer insulating film and a circuit device region under the interlayer insulating film.

It is another object of the present invention to reduce the cell size of a memory by effectively locating a pad array on the above-described nano tube cell array.

In an embodiment, a memory device using a multiple layer nano tube cell comprises a multiple layer nano tube cell array, a circuit device regions and an insulating layer. The multiple layer nano tube cell array includes a plurality of unit nano tube cells arranged in row and colunm directions. The circuit device region drives the plurality of multiple layer nano tube cell arrays formed on a silicon cell substrate located under the plurality of multiple layer nano tube cell arrays. The insulating layer, formed between the plurality of multiple layer nano tube cell arrays on the circuit device region, inter-insulates the plurality of multiple layers nano tube cell rays and the circuit device region. Here, each of the plurality of nano tube cells comprises a capacitor and a PNPN nano tube switch. One terminal of the capacitor is connected to a word line. The PNPM nano tube switch, which includes at least two or more PNPN diode devices successively connected in series and divided into two groups each connected in parallel between a bit line and the other terminal of the capacitor, is selectively switched depending on the voltage applied to the word line and the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
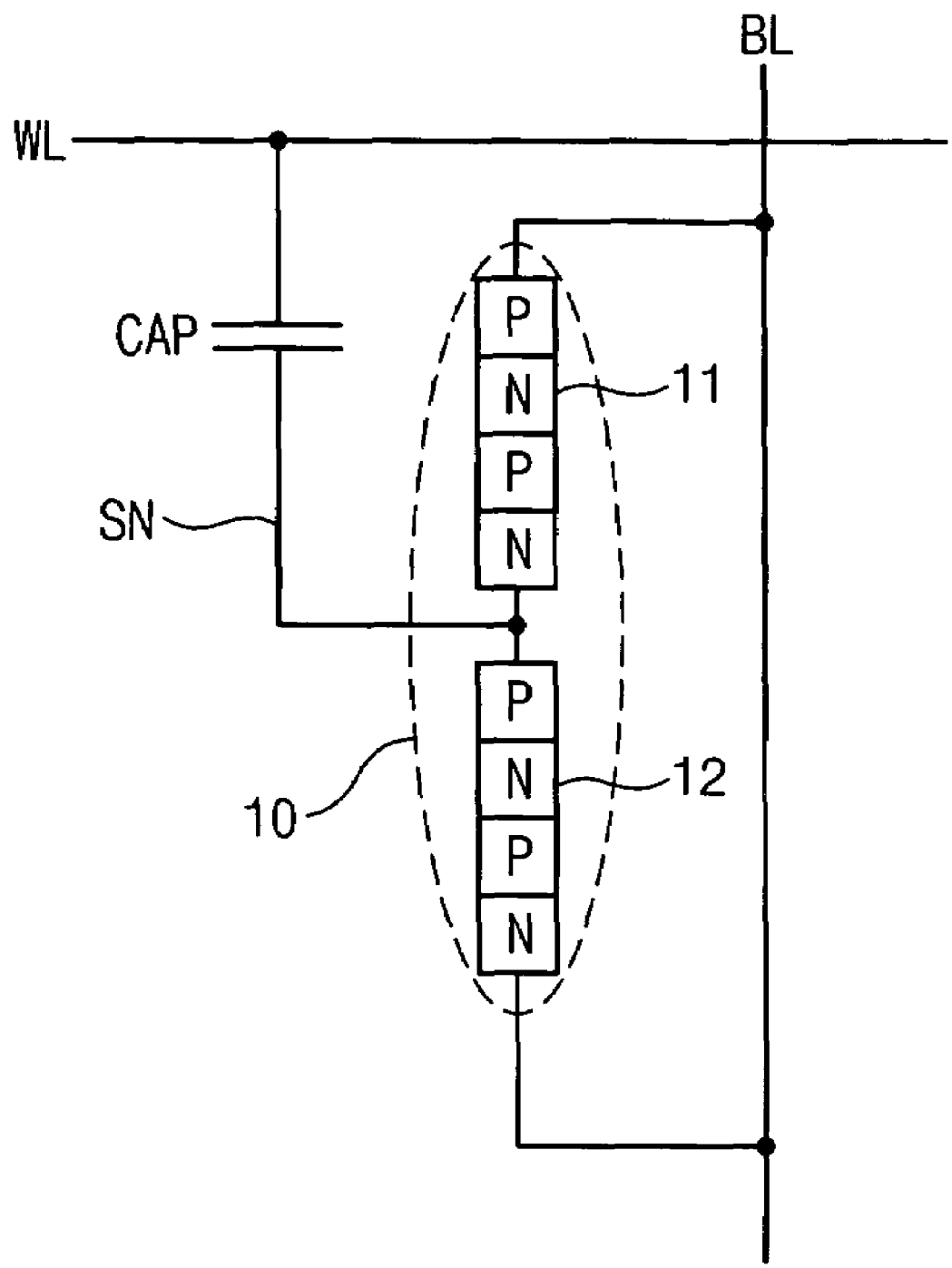
FIG. 1 is a diagram illustrating a unit nano tube cell according to an embodiment of the present invention.

FIG. 1 is a diagram illustrating a unit nano tube cell according to an embodiment of the present invention.

In an embodiment, the unit nano tube cell comprises a capacitor CAP and a PNPN nano tube switch 10. Here, the PNPN nano tube switch 10 comprises PNPN diode switches 11 and 12. The PNPN diode switches 11 and 12 are connected in parallel between a bit line (BL) and a bottom electrode of the capacitor (CAP).

The PNPN diode switch 11 is connected backward between the bit line BL and one electrode of the capacitor CAP, and the PNPN diode switch 12 is connected forward between the bit line BL and one electrode of the capacitor CAP. The other electrode of the capacitor CAP is connected to a word line WL.

Figure 2:
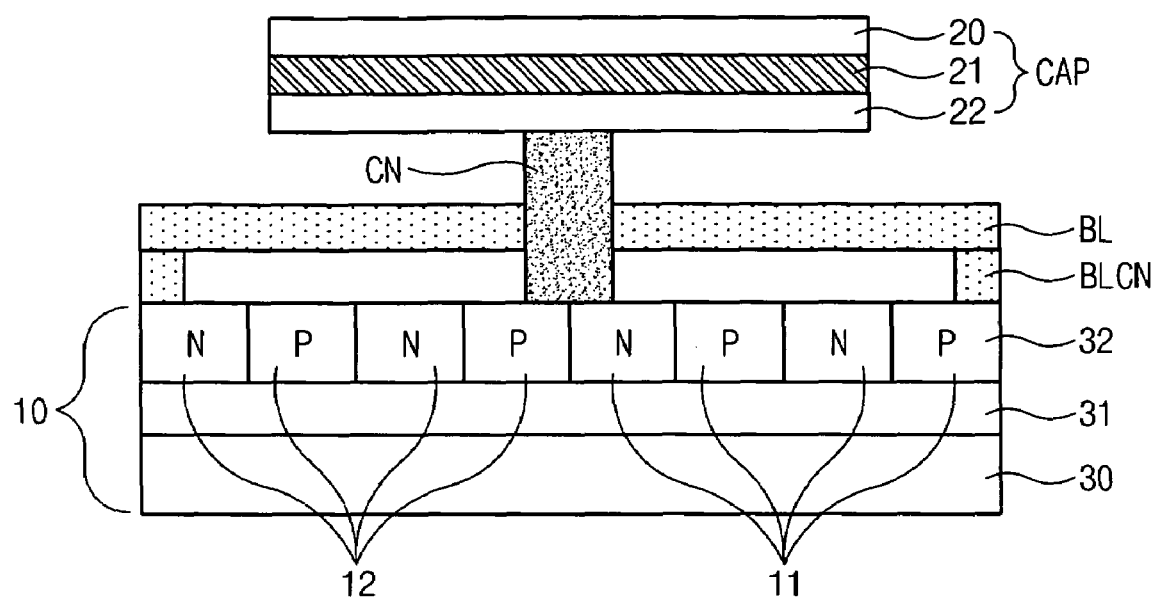
FIG. 2 is a cross-sectional diagram illustrating a multiple layer nano tube cell according to an embodiment of the present invention.

FIG. 2 is a cross-sectional diagram illustrating the multiple layer nano tube cell of FIG. 1.

The PNPN nano tube switch 10 comprises an insulating layer 31 formed on a silicon substrate 30 and a silicon layer 32 formed on the insulating layer 31, to have a SOI (Silicon On Insulator) structure. Here, the insulating layer 31 made of $SiO_2$ is deposited on the silicon substrate 30, and the silicon layer 32 is formed on the insulating layer 31. The silicon layer 32 forms a diode chain with a nano tube type including the PNPN diode switches 11 and 12 made of deposition silicon which are connected serially.

Each of the PNPN diode switches 11 and 12 includes a plurality of P-type regions and N-type regions which are alternately connected in series. The PN diode switch 12 includes a P-type region and a N-type region which are connected serially to the adjacent N-type region of the PNPN diode switch 11.

The bit line BL is formed through a bit line contact node BLCN on the N-type region of the PNPN diode switch 12 and the P-type region of the PNPN diode switch 11. Also, the P-type region of the PNPN diode switch 12 and the N-type region of the PNPN diode switch 11 are connected to a bottom electrode 22 of the capacitor CAP through a common contact node CN.

Here, the capacitor CAP comprises a top electrode 20, a dielectric layer 21 and a bottom electrode 22. The top electrode 20 of the capacitor CAP is connected to the word line WL.

Figure 3:
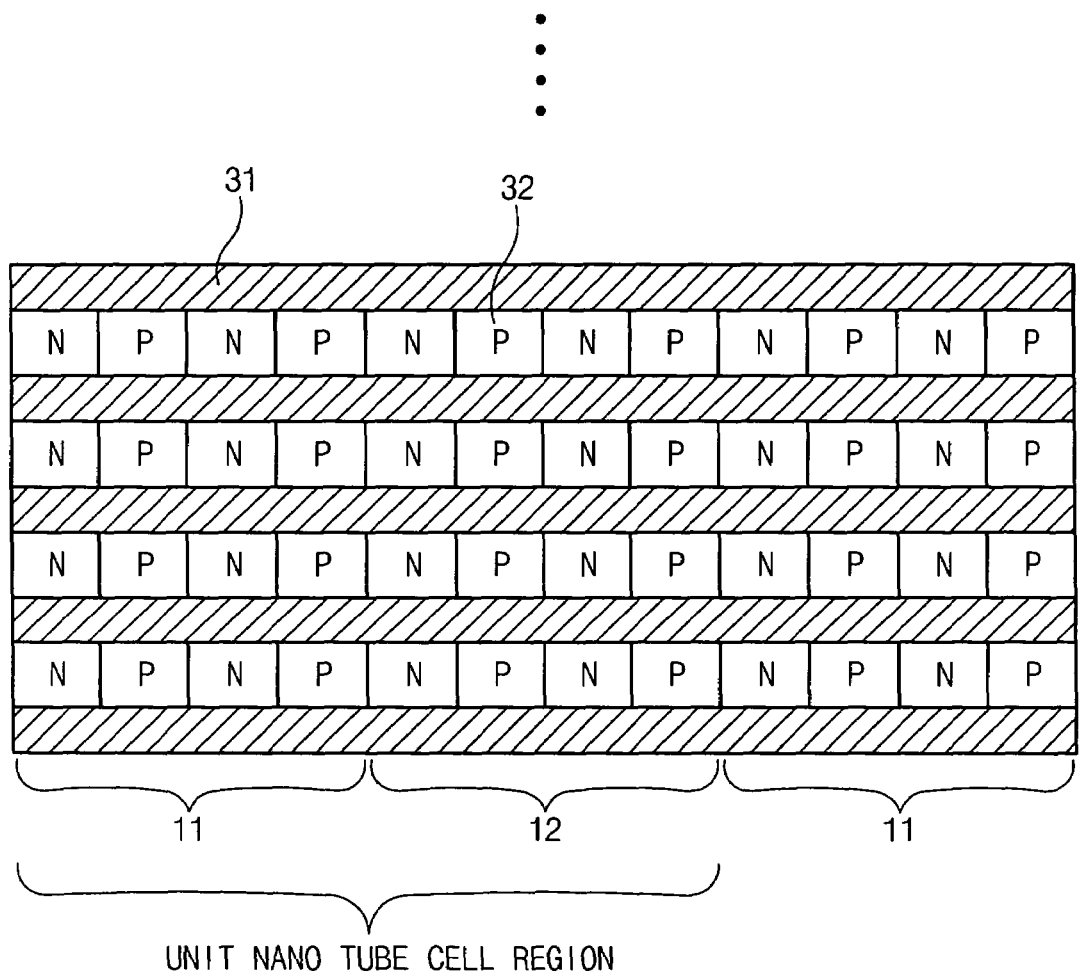
FIG. 3 is a plane diagram illustrating a PNPN nano tube switch of FIG. 1.

FIG. 3 is a plane diagram illustrating the PNPN nano tube switch 10 of FIG. 1.

The PNPN nano tube switch 10 includes the PNPN diode switches 11 and 12 which are formed of the silicon layer 32 and successively connected with a serial chain type. That is, one PNPN nano tube switch 10 comprises the PNPN diode switches 11 and 12 which are connected serially. A nano tube cell adjacent to the one nano tube cell in the same direction includes the PNPN diode switches 11 and 12 which are connected serially.

The PNPN nano tube switch 10 is arranged as a plurality of layers, and the upper PNPN nano tube switch 10 and the lower PNPN nano tube switch 10 are separated by the insulating layer 31.

As a result, one nano tube cell region is configured by selecting one of the PNPN diode switches 11 and 12 successively from diode devices connected in series.

Figure 4:
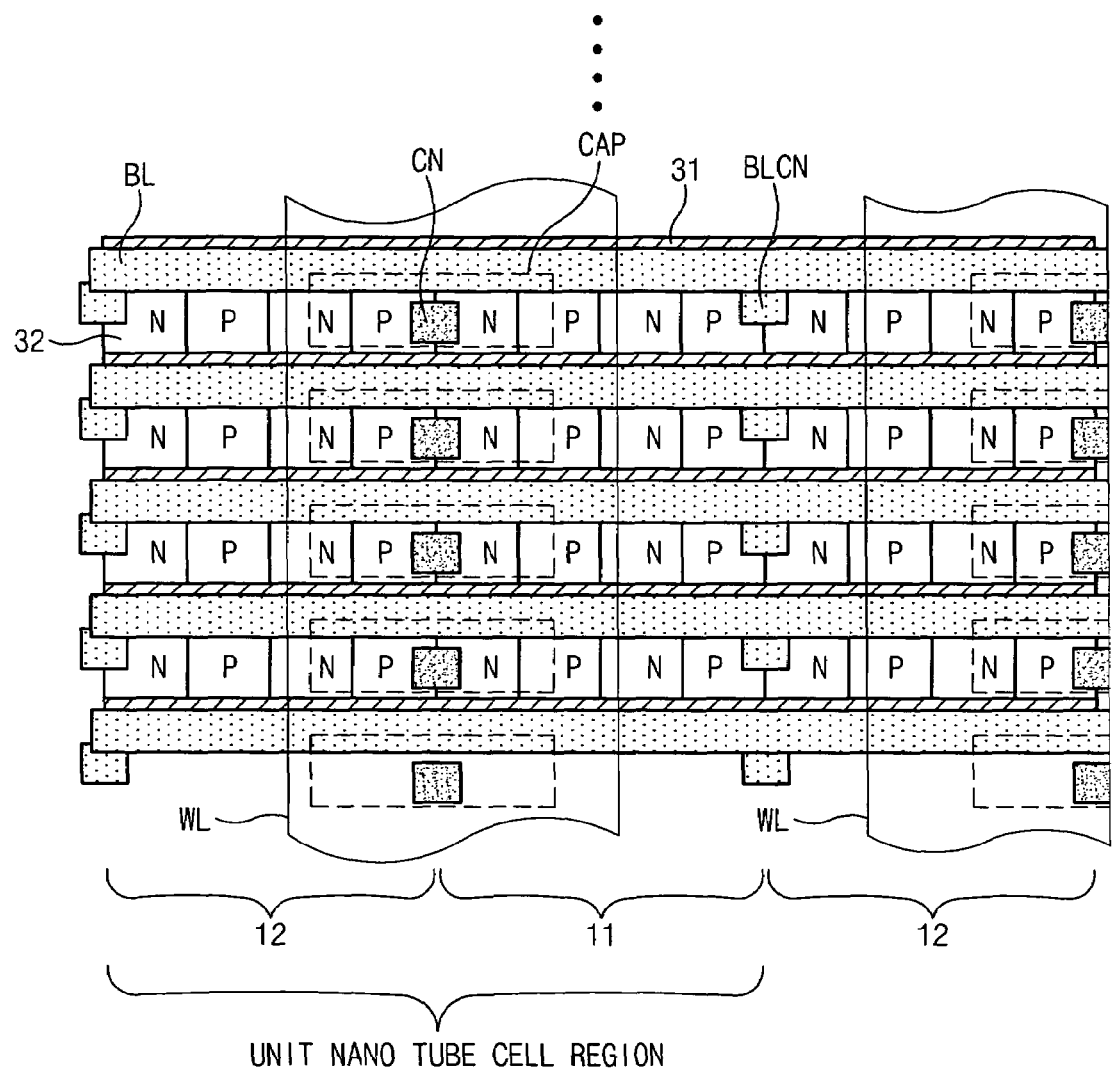
FIG. 4 is a plane diagram illustrating a multiple layer nano tube cell according to an embodiment of the present invention.

FIG. 4 is a plane diagram illustrating the multiple layer nano tube cell of FIG. 1.

The silicon layer 32 made of deposition silicon forms the PNPN diode switches 11 and 12 which are connected serially. In each silicon layer 32, its upper and lower portions are insulated through the insulating layer 31. In the PNPN nano tube switch 10, the P-type region of the PNPN diode switch 12 is formed adjacent to the N-type region of the PNPN diode switch 11 to be connected in common to a contact node CN of the capacitor CAP.

Also, the N-type region of the PNPN diode switch 12 and the P-type region of the PNPN diode switch 11 are connected to the bit line BL through the bit line contact node BLCN. The bit line contact node BLCN is connected in common to the bit line contact node BLCN of the adjacent nano tube cell. That is, the same bit line contact node BLCN is connected in common to the P-type region of the PNPN diode switch 11 and the N-type region of the adjacent PNPN diode switch 12. A word line WL is formed on the capacitor CAP.

Figure 5:
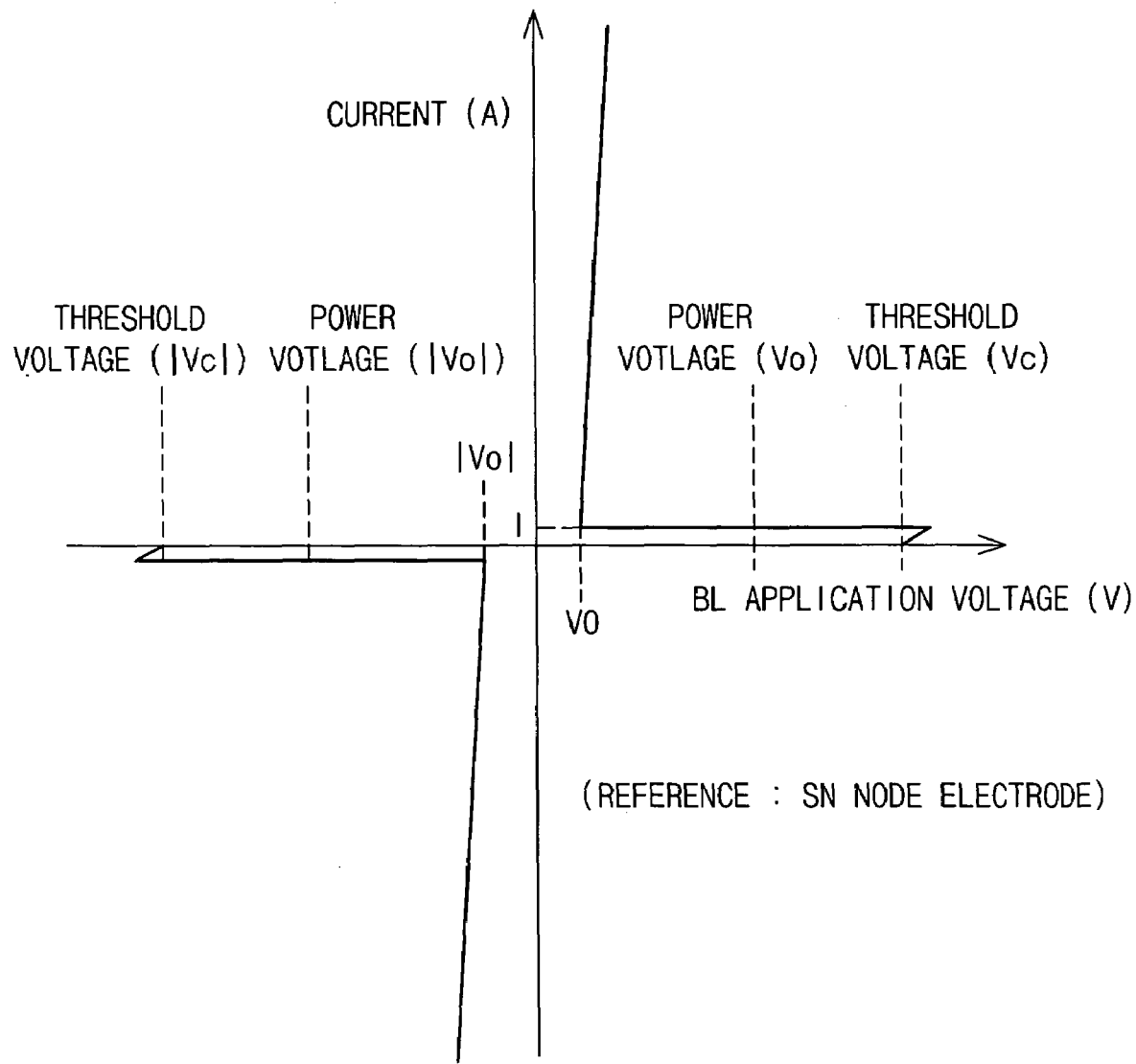
FIG. 5 is a diagram illustrating the operation of the multiple layer nano tube cell of FIG. 1.

FIG. 5 is a diagram illustrating the operation of the PNPN nano tube cell 10 of FIG. 1.

When a voltage applied to the bit line BL increases in a positive direction based on a node SN, the nano tube switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the serial diode switch 10 is turned on, so that current dramatically increases. Here, when the voltage applied to the bit line BL is over the threshold voltage Vc, a value of current I depends on that of a resistor (not shown) which serves as load connected to the bit line BL.

A large amount of current can flow even when a small voltage V0 applied to the bit line BL after the PNPN diode switch 11 is turned on. Here, the PNPN diode switch 12 is kept off by the backward operation characteristic.

On the other hand, if the voltage applied to the bit line BL increases in a negative direction based on the node SN, that is, when a constant voltage is applied to the word line WL, the nano tube switch 10 is kept off by the forward operation characteristic of the PNPN diode switch 12, so that current does not flow in an operating voltage |Vo| having an absolute value. Thereafter, when a voltage applied to the word line WL increases more to reach a threshold voltage |Vc| having an absolute value, the PNPN diode switch 12 is turned on by the forward operation characteristic of the diode to turn on the PNPN nano tube switch 10, so that current increases dramatically. Here, the PNPN diode switch 11 is kept off by the backward operation characteristic.

Figure 6:
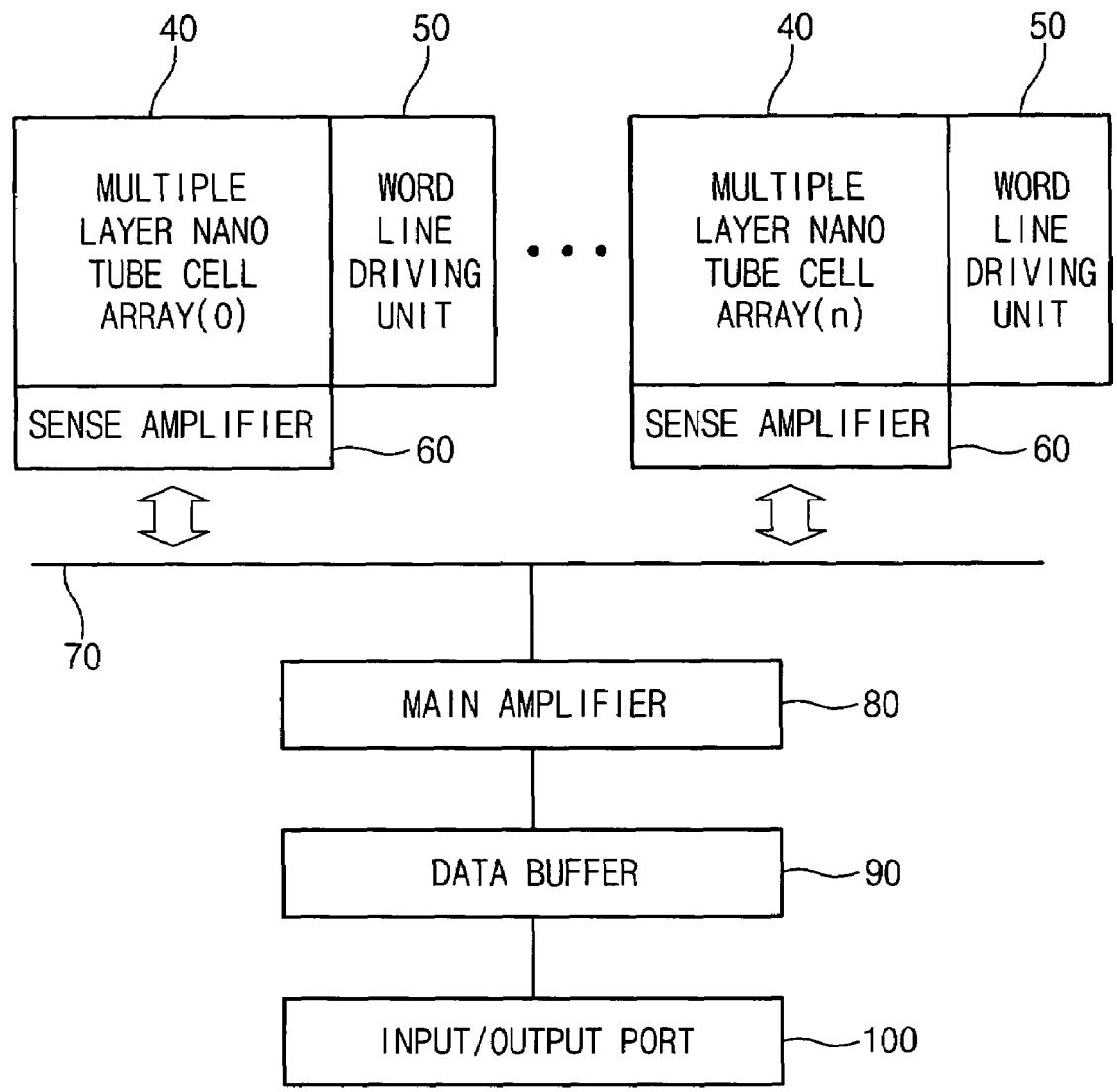
FIG. 6 is a diagram illustrating a memory device using a multiple layer nano tube cell according to an embodiment of the present invention.

FIG. 6 is a diagram illustrating a memory device using a multiple layer nano tube cell according to an embodiment of the present invention.

In an embodiment, the memory device comprises a plurality of multiple layer nano tube cell arrays 40, a plurality of word line driving units 50, a plurality of sense amplifiers 60, data bus 70, a main amplifier 80, a data buffer 90 and an input/output port 100.

Each multiple layer nano tube cell array 40 comprises a plurality of nano tube cells of FIG. 1 arranged in row and column directions. A plurality of word lines WL arranged in the row direction are connected to the word line driving unit 50. A plurality of bit lines BL arranged in the column direction are connected to the sense amplifier 60.

Here, one multiple layer nano tube cell array 40 is correspondingly connected to one word line driving unit 50 and one sense amplifier 60.

A plurality of sense amplifiers 60 share one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 externally outputs output data applied from the data buffer 90, and applies externally applied input data to the data buffer 90.

The multiple layer nano tube cell array 40 comprises a plurality of word lines WL arranged in the row direction and a plurality of bit lines BL arranged in the column direction. Since a unit cell C is located only where the word line WL and the bit line BL, a cross point cell can be provided which does not require an additional area.

Here, the cross point cell does not comprise a NMOS transistor which uses additional a word line WL gate control signal. In the cross point cell, the capacitor CAP is located at the cross point where the bit line BL and the word line WL are crossed by using the PNPN nano tube switch 10 that comprises two connection electrode nodes.

Figure 7:
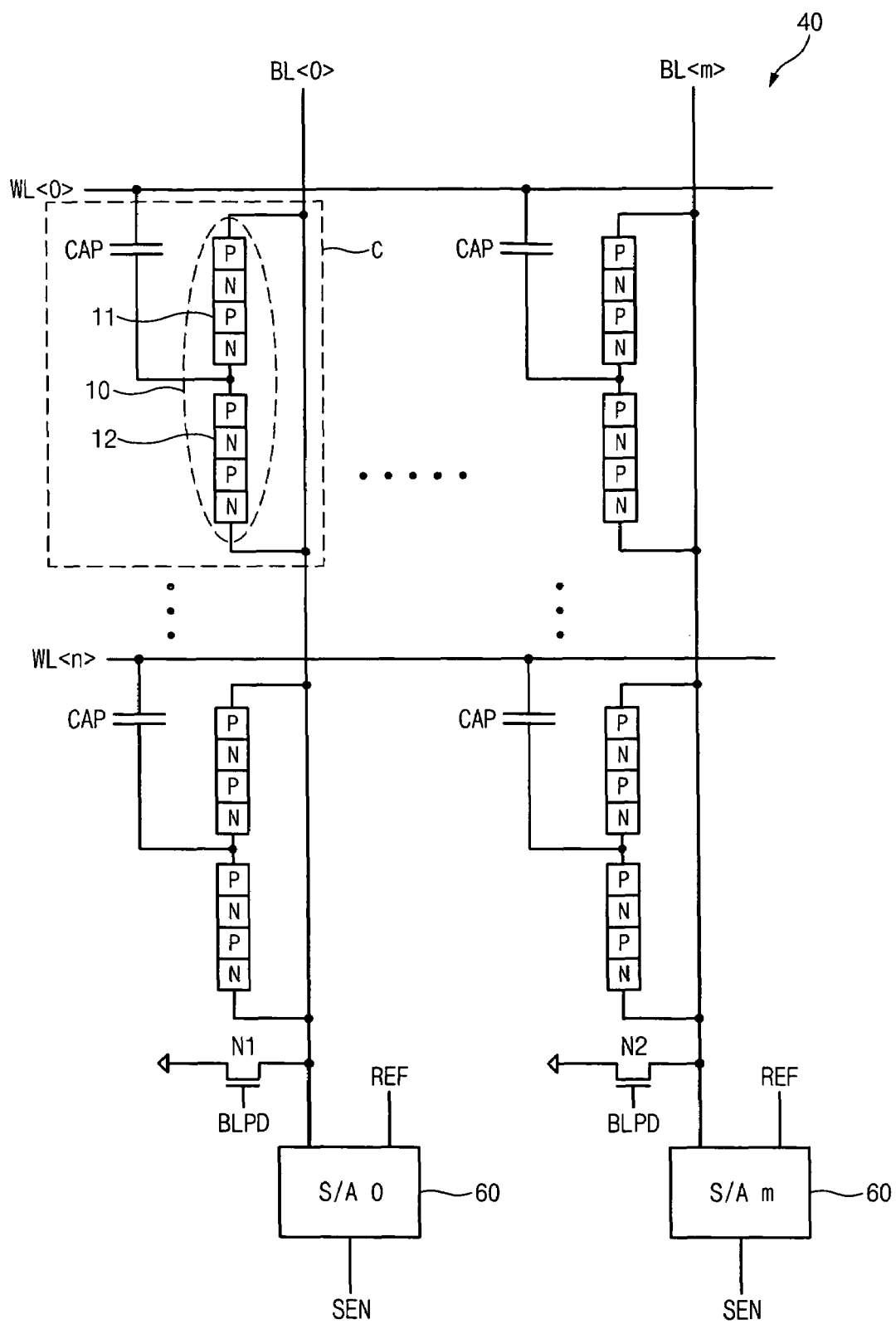
FIG. 7 is a circuit diagram illustrating a multiple layer nano tube cell array of FIG. 6.

FIG. 7 is a circuit diagram illustrating the multiple layer nano tube cell array 40 of FIG. 6.

The multiple layer nano tube cell array 40 comprises a plurality of word lines WL<0>~WL<n> each arranged in the row direction and a plurality of bit lines BL<0>~BL<m> each arranged in the column direction. A unit cell C is located only in a region where the word line WL and the bit line BL are crossed. Here, one unit cell C comprises the capacitor CAP and the PNPN nano tube switch 10.

The plurality of sense amplifiers 60 are connected one by one to the plurality of bit lines BL<0>~BL<m>. When a sense amplifier enable signal SEN is activated, each sense amplifier 60 compares a predetermined reference voltage REF with a voltage applied from the bit line BL and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL and pull down the bit line BL to the ground level.

The above-described nano tube cell array 40 is configured so that each of the capacitors CAP can store one data.

Figure 8:
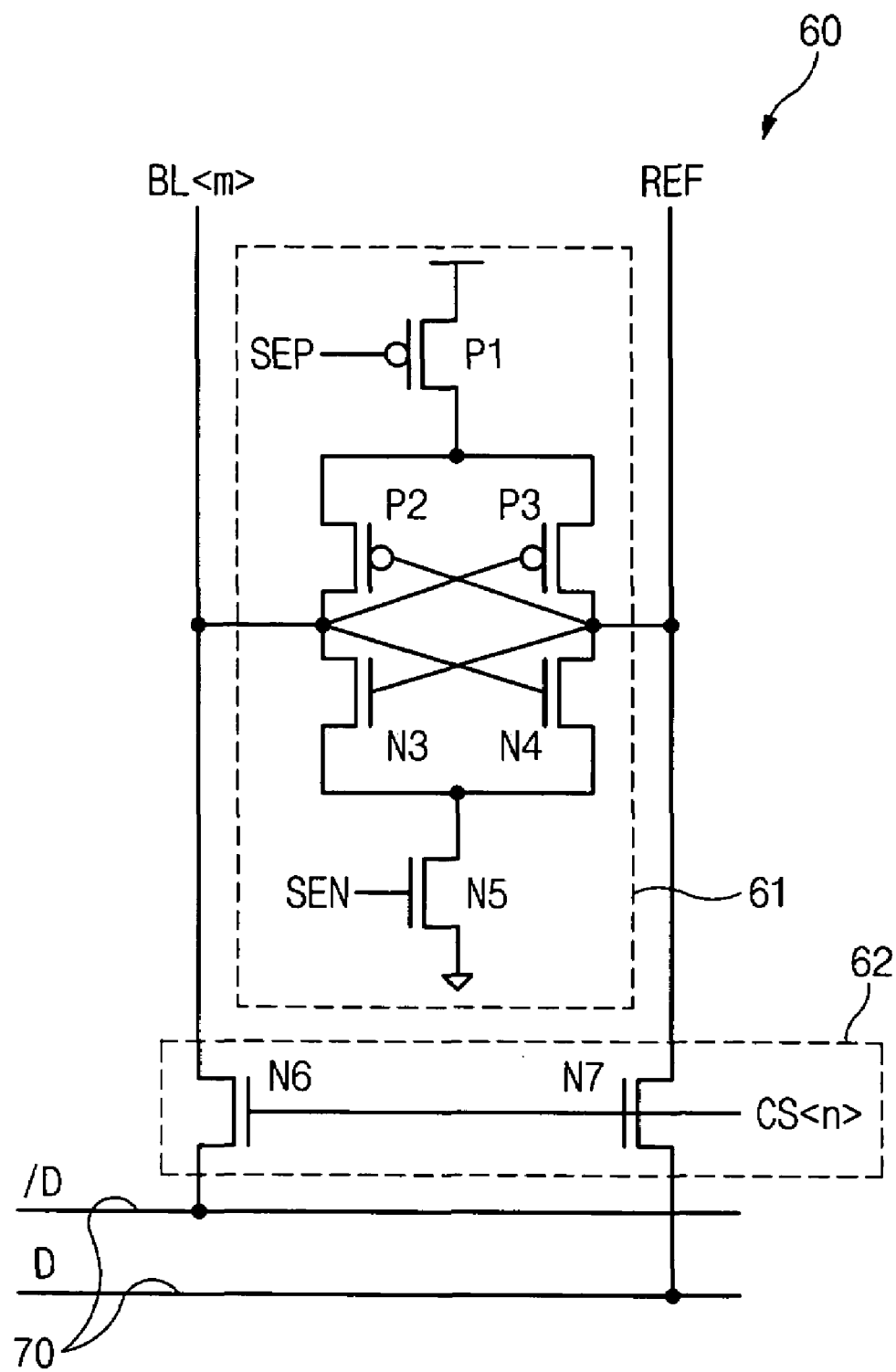
FIG. 8 is a circuit diagram illustrating a sense amplifier of FIG. 6.

FIG. 8 is a circuit diagram illustrating the sense amplifier of FIG. 7.

The sense amplifier 60 comprises an amplification unit 61 and a column selection switching unit 62.

Here, the amplification unit 61 comprises PMOS transistors P1~P3 and NMOS transistors N3~N5. The PMOS transistor P1, connected between a power voltage terminal and a common source of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N5, connected between a ground voltage terminal and a common source of NMOS transistors N3 and N4, has a gate to receive the sense amplifier enable signal SEN. The cross-coupled NMOS transistors N3 and N4 latch the ground voltage applied through the NMOS transistor N5.

Here, the sense amplifier enable signal SEN has an opposite phase to that of the sense amplifier enable signal SEP. When the sense amplifier enable signal SEN is activated, the amplification unit 61 is operated. One output terminal of the amplification unit 61 is connected to the bit line BL<m>, and the other output terminal of the amplification unit 61 is connected to a terminal to receive the reference voltage REF.

The column selection switching unit 62 comprises NMOS transistors N6 and N7. The NMOS transistor N6, connected between the bit line BL<m> and the data bus 70, controls input/output operations of data /D in response to a column selecting signal CS<n> applied through its gate. The NMOS transistor N7, connected between the data bus 70 and the terminal to receive the reference voltage REF, controls input/output operations of data D in response to the column selecting signal CS<n> applied through its gate.

Figure 9:
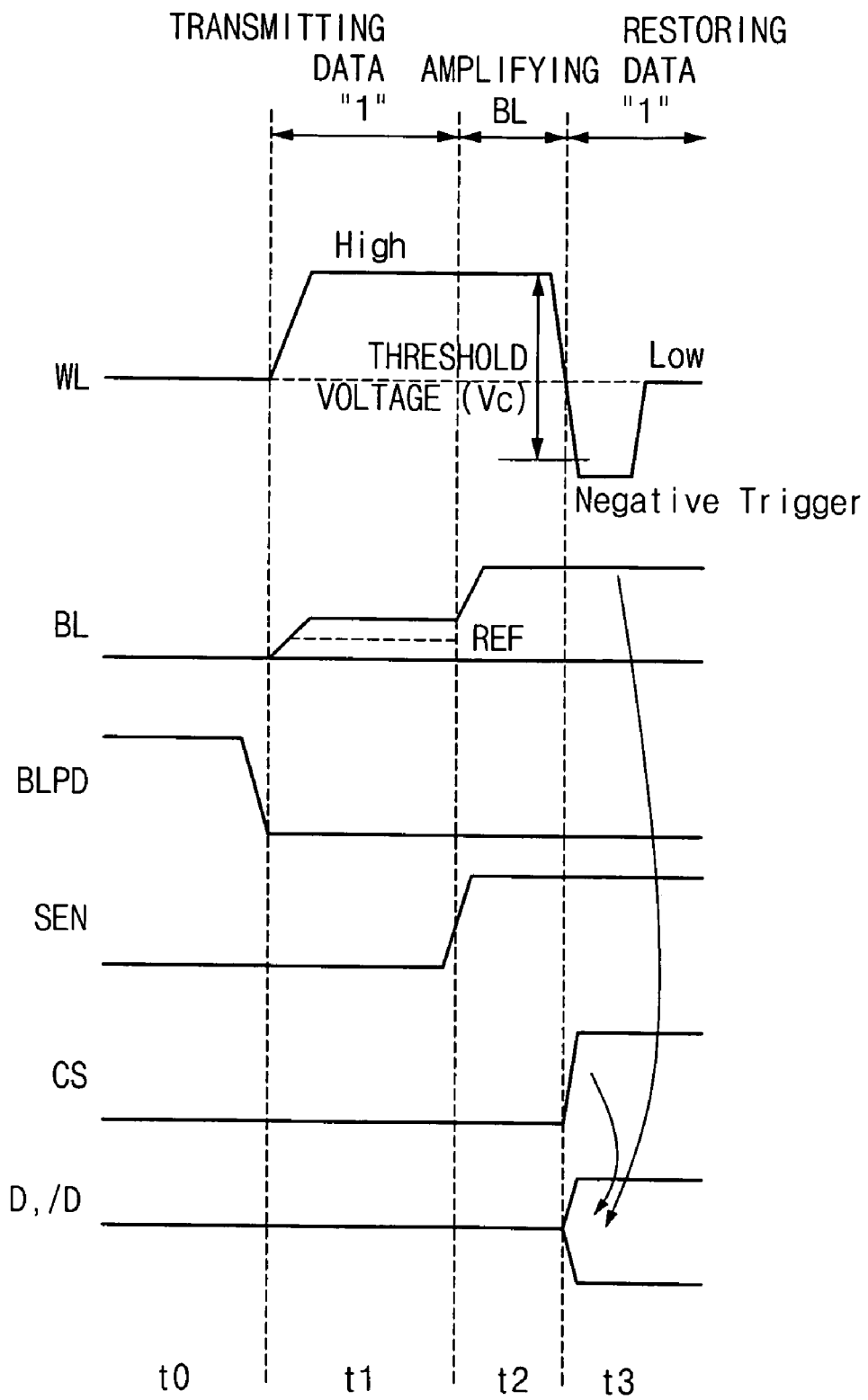
FIG. 9 is a timing diagram illustrating the read mode of the memory device using a multiple layer nano tube cell according to an embodiment of the present invention.

FIG. 9 is a timing diagram illustrating the read mode of the memory device using a multiple layer nano tube cell according to an embodiment of the present invention.

In a period t0, a bit line pull-down signal BLPD is activated to apply the ground voltage to the bit line BL, so that the bit line BL is precharged to the ground level.

Thereafter, when a period t1 starts, if the word line WL transits to 'high' and a predetermined voltage is applied to the word line WL, the PNPN diode switch 12 of the PNPN nano tube switch 10 is turned on. As a result, data stored in the nano tube cell is transmitted to the bit line BL, and the bit line pull-down signal BLPD transits to 'low'.

Here, the PNPN diode switch 12 is kept off when data stored in the capacitor device CAP is 'low', so that the voltage level of the bit line BL is not changed. On the other hand, the PNPN diode switch 12 is turned on only when the data stored in the capacitor CAP is 'high', so that the voltage level of the bit line BL rises to a high sensing voltage.

In a period t2, the sense amplifier enable signal SEN is activated to amplify data in the bit line BL.

Thereafter, in a period t3, the voltage of the word line WL transits to a negative voltage which is a value below the threshold voltage Vc. That is, a difference between the low voltage level of the bit line BL and the negative voltage level of the word line WL does not reach the state of the threshold voltage Vc to turn on the PNPN diode switch 11 of the PNPN nano tube switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on to restore data "1" in the nano tube cell.

After the PNPN diode switch 11 is turned on, as shown in FIG. 5, a large amount of current can flow although a small voltage V0 is applied to the bit line BL. As a result, in the period t3, although the voltage of the word line WL rises from the negative voltage to the low level, current can flow sufficiently.

In the period t3, if a column selecting signal CS transits to 'high', the NMOS transistors N6 and N7 of the column selection switching unit 62 are turned on. Then, the data D and /D in the bit line BL are outputted to the data bus 70, so that data stored in the nano tube cell C can be read.

Figure 10:
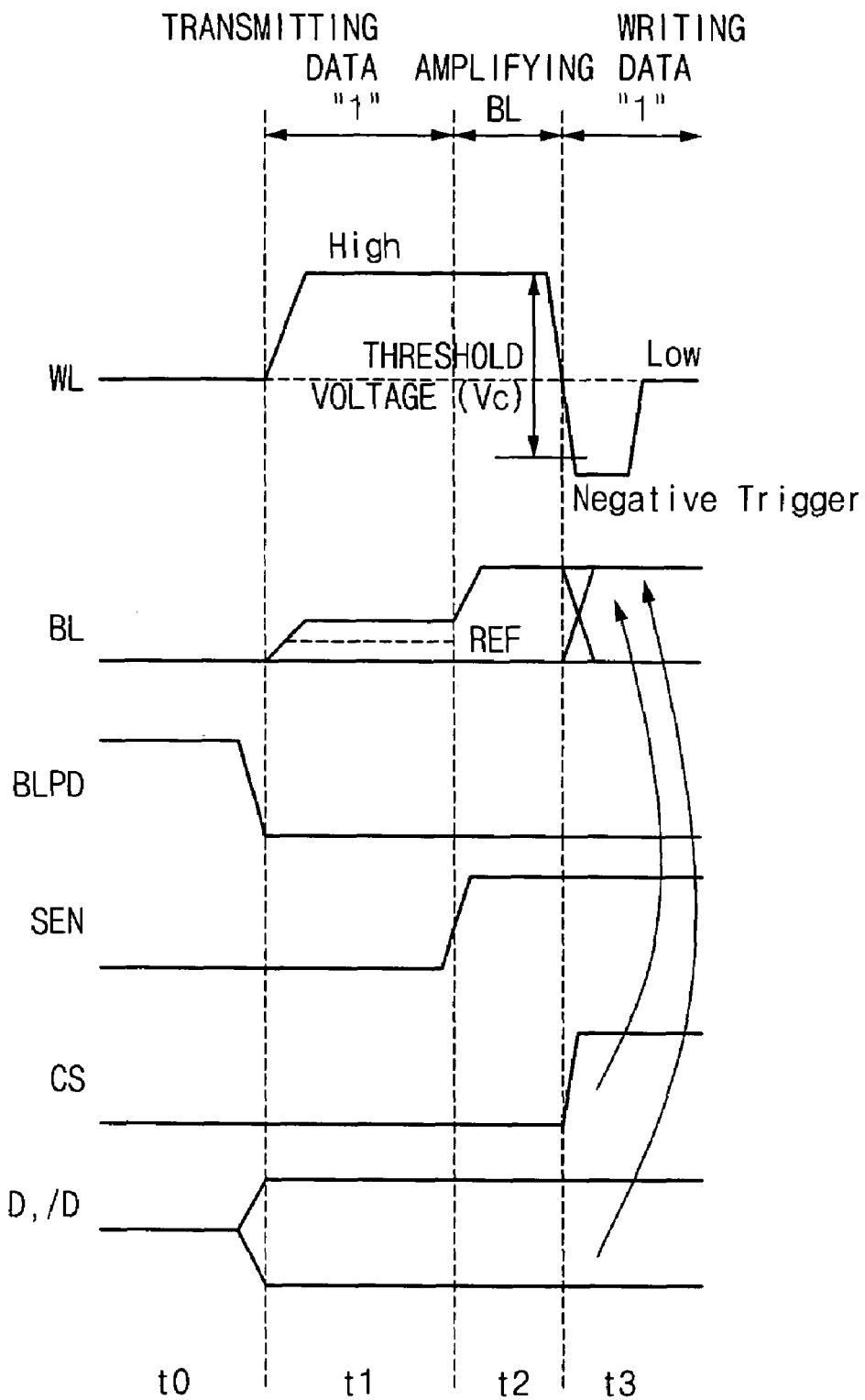
FIG. 10 is a timing diagram illustrating the write mode of the memory device using a multiple layer nano tube cell according to an embodiment of the present invention.

FIG. 10 is a timing diagram illustrating the write mode of the memory device using a multiple layer nano tube cell according to an embodiment of the present invention.

In a period t0, the bit line pull-down signal BLPD is activated to apply the ground voltage to the bit line BL, so that the bit line BL is precharged to the ground level.

Thereafter, when a period t1 starts, if the word line WL transits to 'high' and a predetermined voltage is applied to the word line WL, the PNPN diode switch 12 of the PNPN nano tube switch 10 is turned on to transmit the data stored in the nano tube cell to the bit line BL. Here, the bit line pull-down signal BLPD transits to 'low'. Then, new data D and /D to be written through the data bus 70 are inputted.

Here, the PNPN diode switch 12 is kept off when the data stored in the capacitor CAP is 'low', so that the voltage level of the bit line BL is not changed. On the other hand, the PNPN diode switch 12 is turned on only when the data stored in the capacitor CAP is 'high', so that the voltage level of the bit line BL rises to a high sensing voltage level.

In a period t2, the sense amplifier enable signal SEN is activated to amplify data in the bit line BL.

Thereafter, in a period t3, the voltage of the word line WL transits to the negative voltage. That is, a difference between the low voltage level of the bit line BL and the negative voltage level of the word line WL does not reach the state of the threshold voltage Vc to turn on the PNPN diode switch 11 of the PNPN nano tube switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on, so that data "1" is written in the nano tube cell.

After the PNPN diode switch 11 is turned on, as shown in FIG. 7, a large amount of current can flow although a small voltage V0 is applied to the bit line BL. As a result, in the period t3, although the voltage of the word line WL rises from the negative voltage to the low level, current can flow sufficiently.

In the period t3, if a column selecting signal CS transits to 'high', the NMOS transistors N6 and N7 of the column selection switching unit 62 are turned on. Then, the data D and /D inputted through the data bus 70 are applied to the bit line BL.

Figure 11:
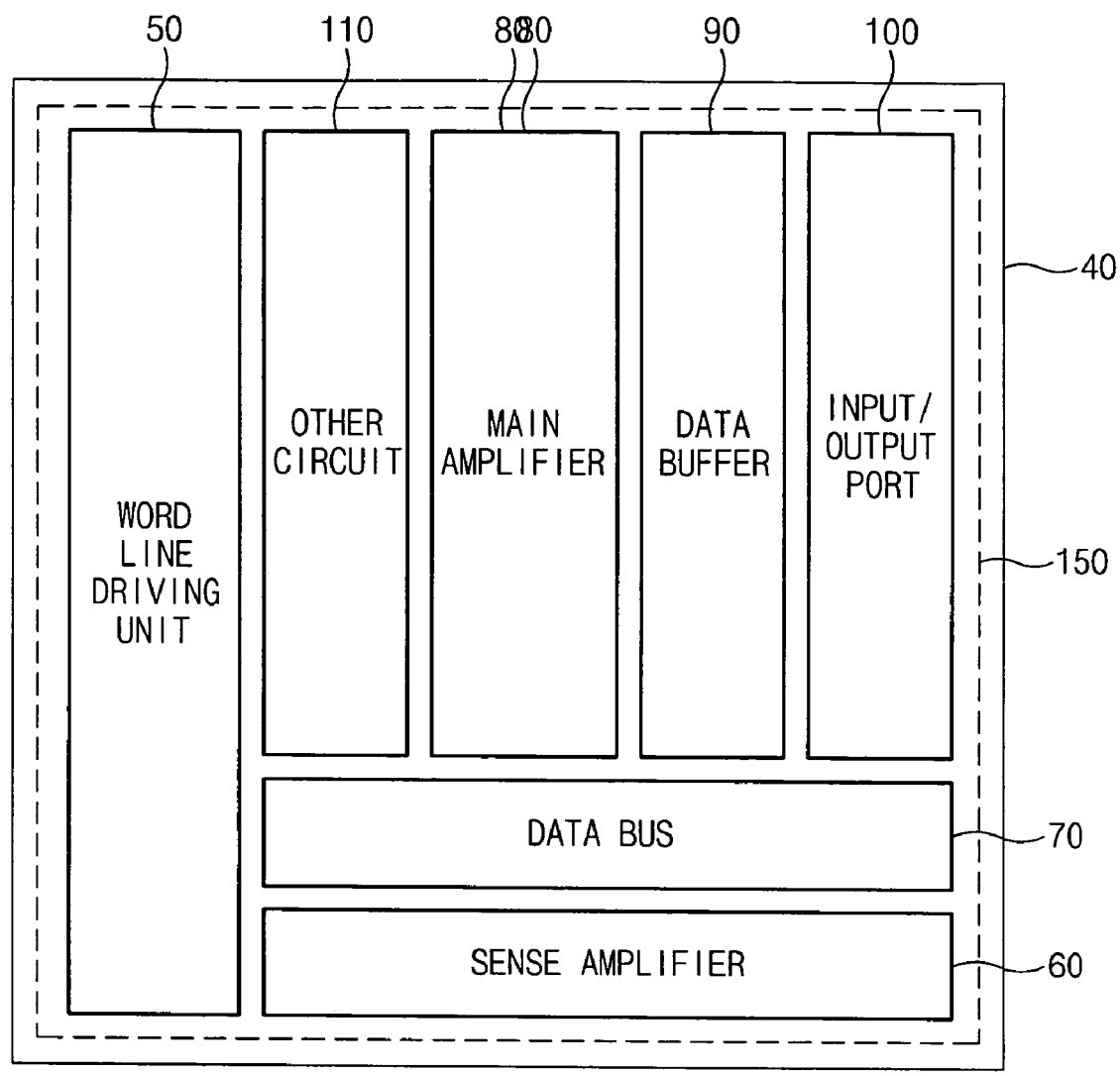
FIG. 11 is a plane diagram illustrating a memory device using a multiple layer nano tube cell according to an embodiment of the present invention.

FIG. 11 is a plane diagram illustrating a memory device using a multiple layer nano tube cell according to an embodiment of the present invention.

In an embodiment, the insulating layer 31 is interposed between the multiple layer nano tube cell array 40 and a circuit device region 150 including the word line driving unit 50 for driving the multiple layer nano tube cell array 40, the sense amplifier 60 for driving the bit line, the data bus 70, the main amplifier 80, the data buffer 90, the input/output port 100 and other circuits 110.

Here, the circuit device region 150 is formed in the silicon substrate 30, and the multiple layer nano tube cell array 40 is formed in the silicon layer 32 formed of deposition silicon. The multiple layer nano tube cell array 40 is separated from the circuit device region 150 through the insulating layer 31.

As a result, the cell size can be reduced without additional expansion regions because the multiple layer nano tube cell array 40 and the circuit device region 150 are positioned in different layers based on the insulating layer 31.

Figure 12:
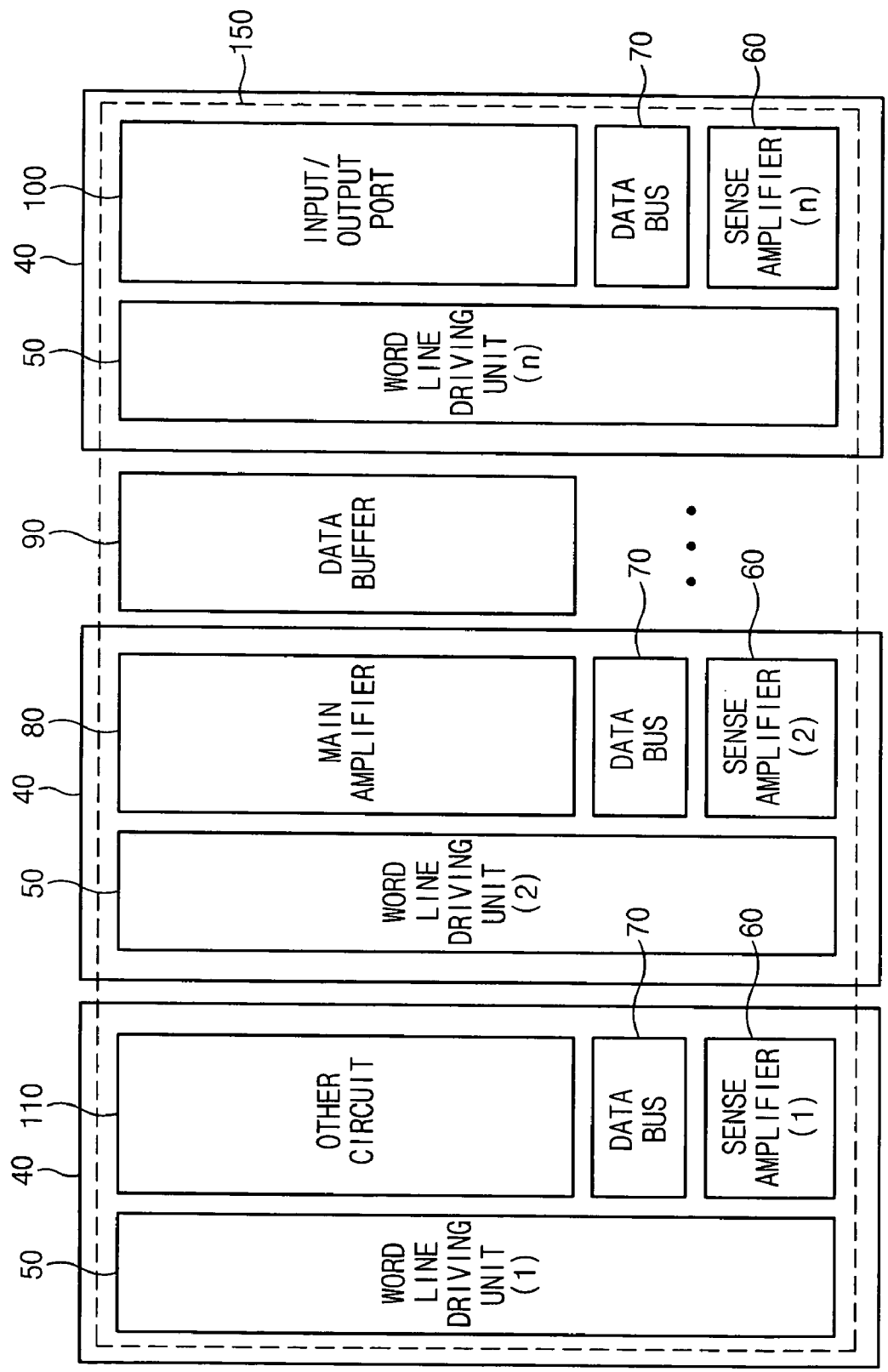
FIG. 12 is a diagram illustrating a memory device using a multiple layer nano tube cell according to another embodiment of the present invention.

FIG. 12 is a diagram illustrating a memory device using a multiple layer nano tube cell according to another embodiment of the present invention.

In an embodiment of FIG. 12, the memory device comprises a plurality of the multiple layer nano tube cell array 40 regions divided as a plurality of cell array blocks. In each cell array block, the word line driving unit 50 for driving a cell array, the sense amplifier 60 and the data bus 70 are additionally comprised. The main amplifier 80, the data buffer 90, the input/output port 100 and other circuits 110 are distributed to different cell array blocks.

Figure 13:
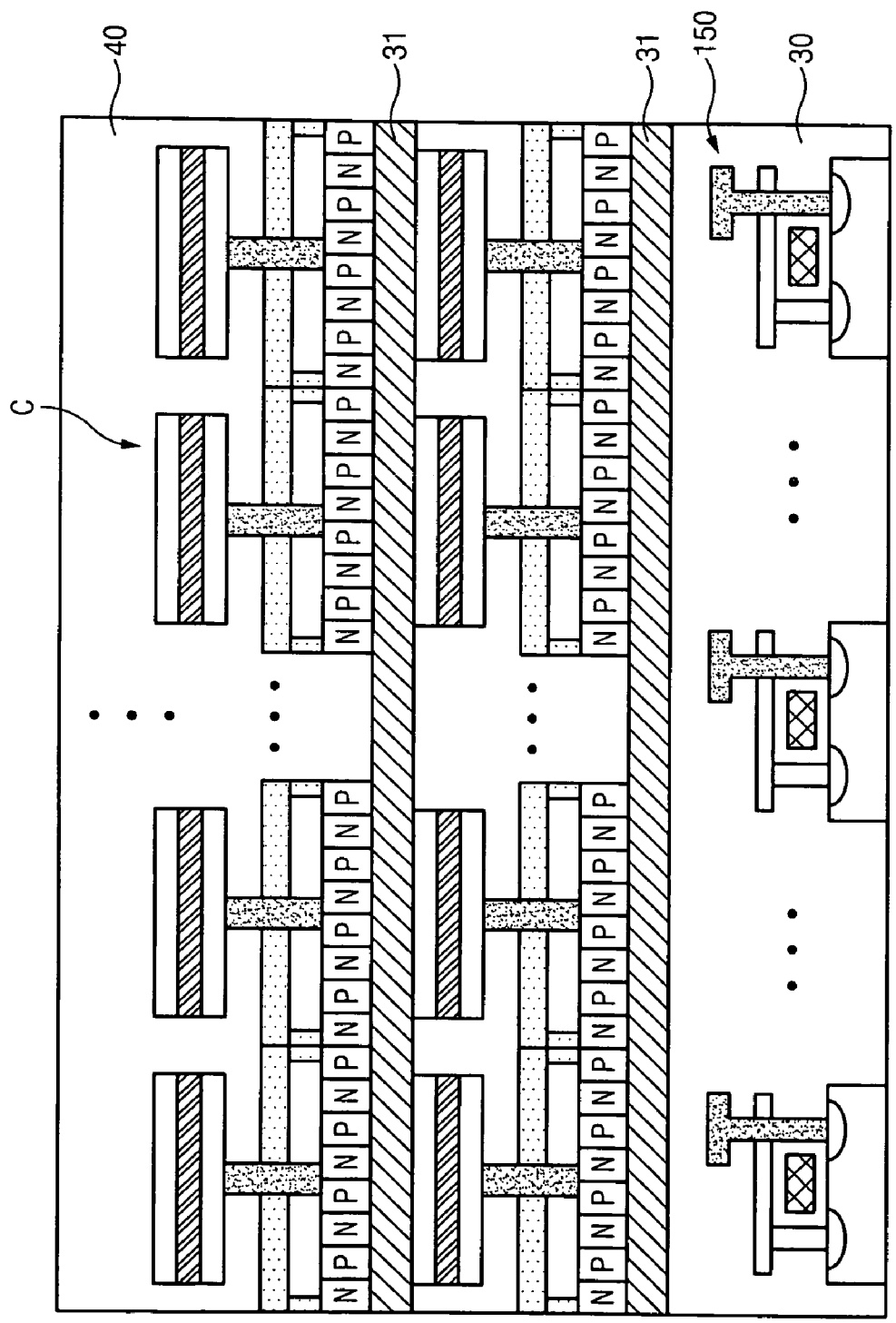
FIG. 13 is a cross-sectional diagram illustrating a memory device using a multiple layer nano tube cell according to an embodiment of the present invention.

FIG. 13 is a cross-sectional diagram illustrating a memory device using a multiple layer nano tube cell according to an embodiment of the present invention.

On the insulating layer 31, a plurality of the multiple layer nano tube cell arrays 40 are located. Here, the nano tube cell array 40 comprises a plurality of unit cells C connected in series. The unit cell C comprises the PNPN nano tube switch 10 including the PNPN diode switches 11 and 12, the word line WL, the bit line BL and the capacitor CAP.

Under the insulating layer 31, the lower silicon substrate 30 including a plurality of the circuit device regions 150 for driving the multiple layer nano tube cell arrays 40 are located.

Figure 14:
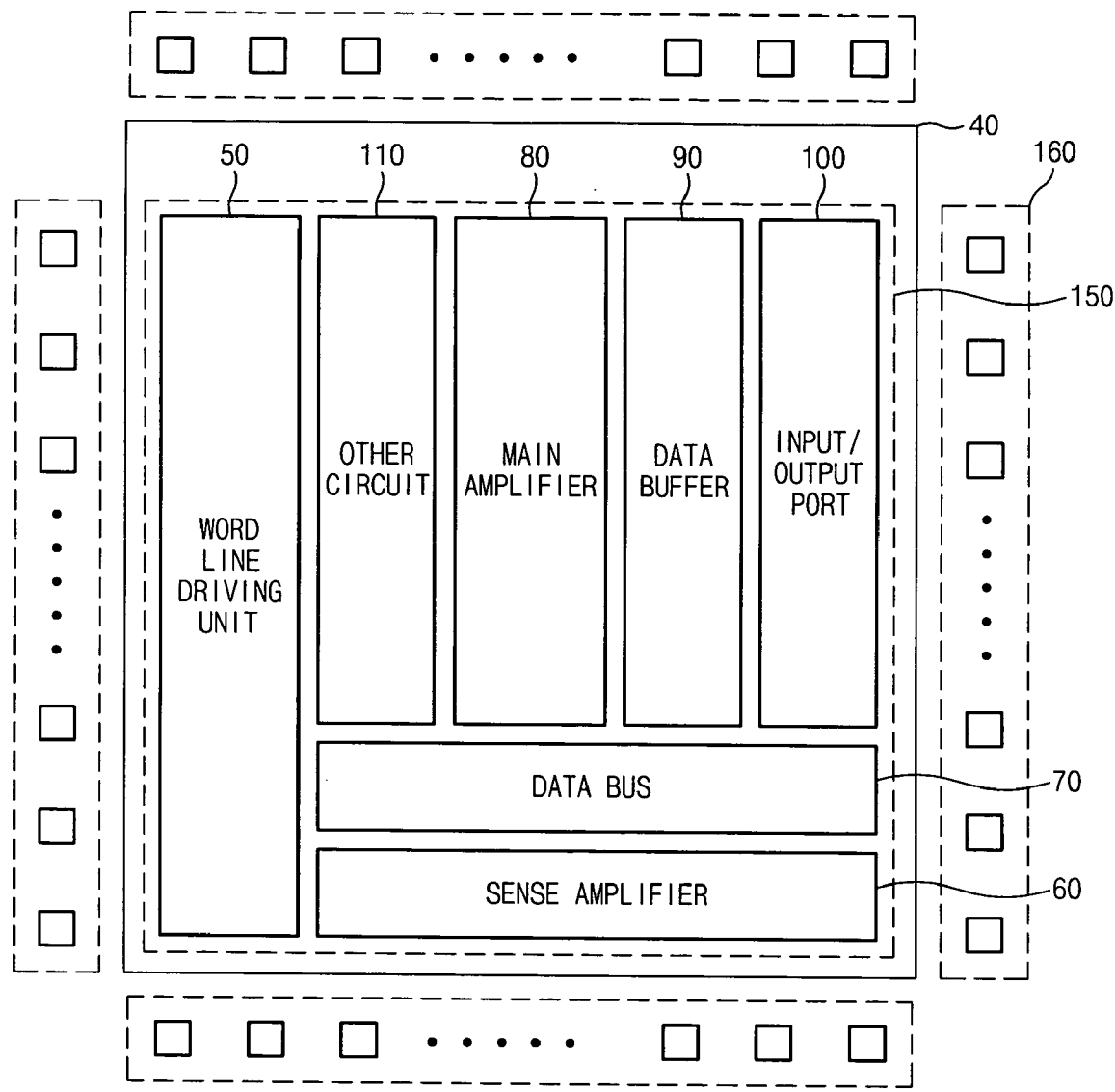
FIG. 14 is a plane diagram illustrating a pad array according to a first embodiment of the present invention.

FIG. 14 is a plane diagram illustrating the pad array 160 according to a first embodiment of the present invention.

In an embodiment of FIG. 14, the pad array 160 which includes address pins and data pins exchange data read/written from the multiple layer nano tube cell array 40 with external control units. The pad array 160 is positioned in an external region apart from the multiple layer nano tube cell array 40 and the circuit device region 150.

In the embodiment of FIG. 14, since a metal layer required in the pad array 160 is connected to that used in the circuit device region 150, the metal layers can be used simultaneously. As a result, a space for forming an additional pad array 160 is not necessary, thereby reducing mask layers.

Figure 15:
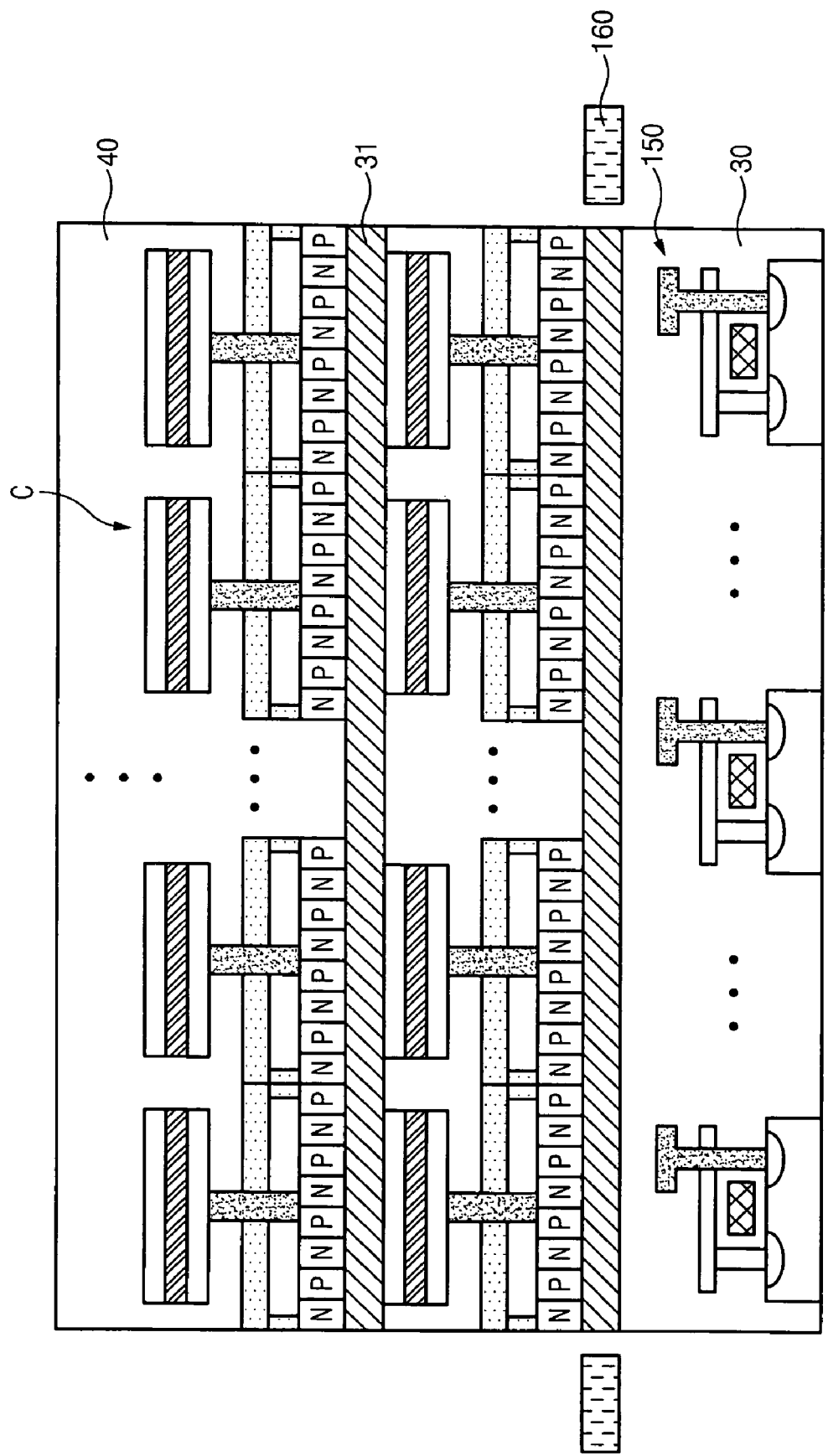
FIG. 15 is a cross-sectional diagram illustrating the pad array of FIG. 14.

FIG. 15 is a cross-sectional diagram illustrating the pad array of FIG. 14.

Referring to FIG. 15, the pad array 160 is formed under the plurality of multiple layer nano tube cell arrays 40, and positioned at the same location as that of the insulating layer 31. The pad array 160 is connected to the circuit device region 150 to used the same metal layer.

Figure 16:
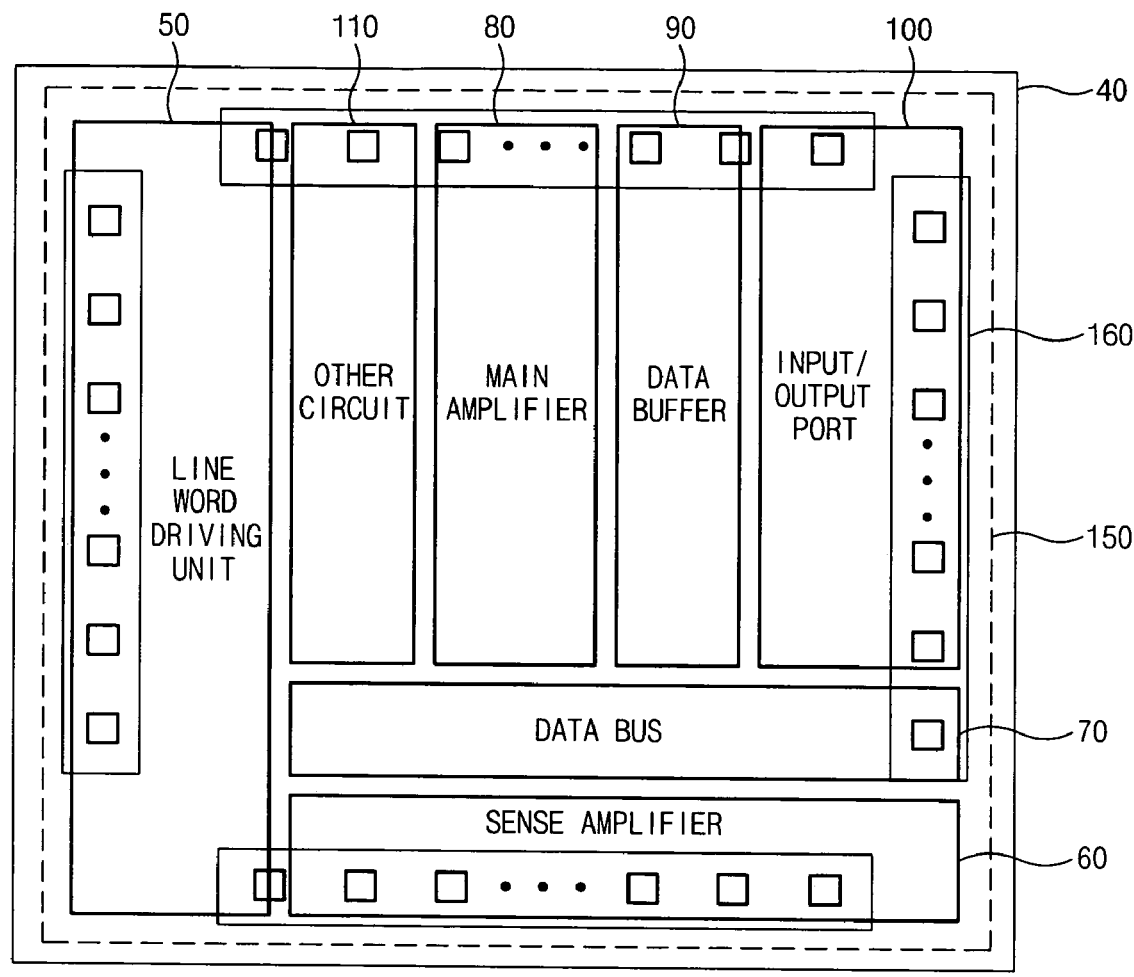
FIG. 16 is a plane diagram illustrating a pad array according to a second embodiment of the present invention.

FIG. 16 is a plane diagram illustrating the pad array 160 according to a second embodiment of the present invention.

The pad array 160 of FIG. 16 is positioned at the same region as that of the multiple layer nano tube cell array 40 and the circuit device region 150.

In the embodiment of FIG. 16, the metal layer required in the pad array 160 is not connected to that of the circuit device region 150, but an additional mask layer for the pad array 160 is comprised. As a result, an additional space for forming the pad array 160 is not necessary, thereby reducing the size of the chip.

Figure 17:
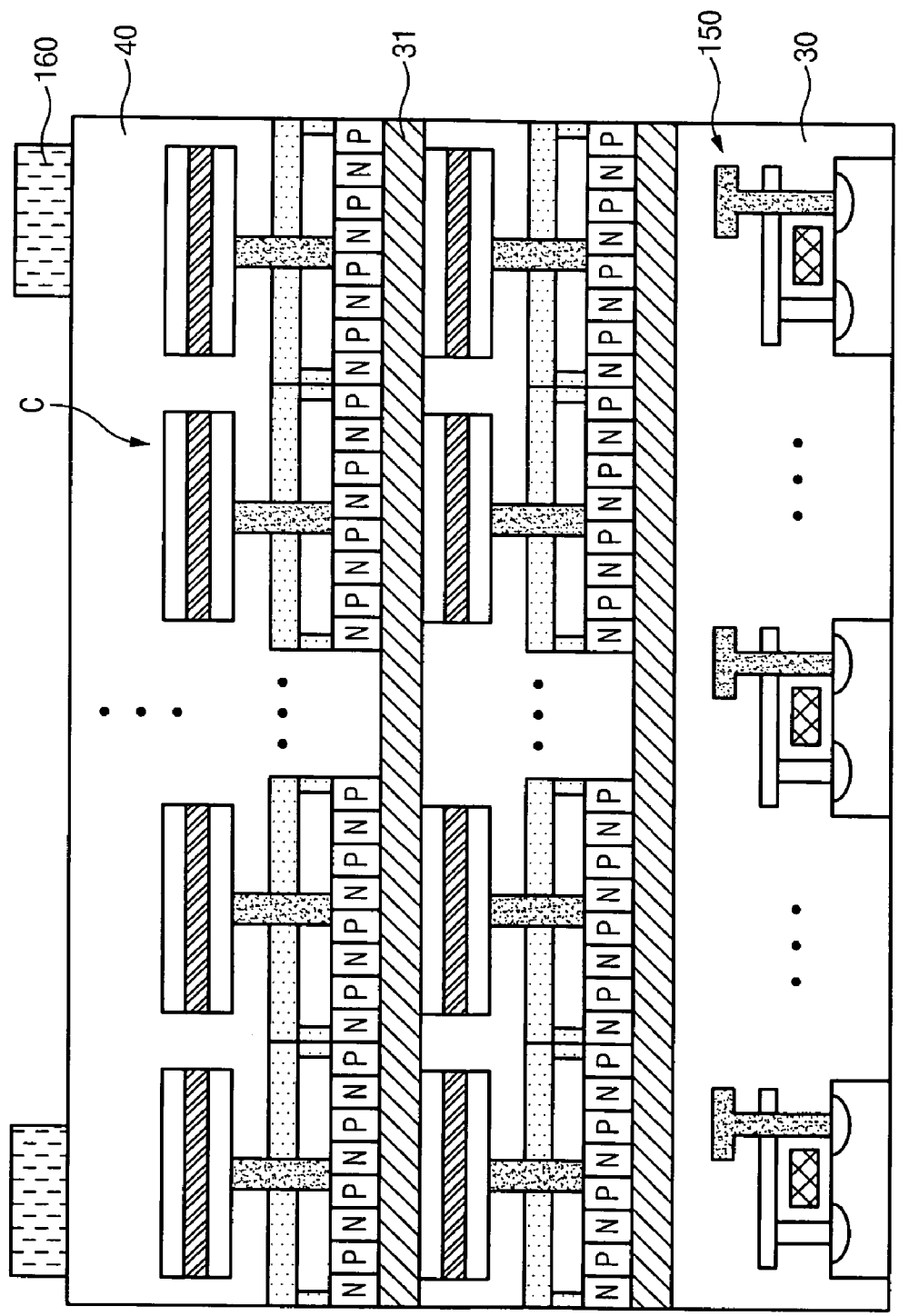
FIG. 17 is a cross-sectional diagram illustrating the pad array of FIG. 16.

FIG. 17 is a cross-sectional diagram illustrating the pad array of FIG. 16.

Referring to FIG. 17, the pad array 160 is formed on the upper size of the multiple layer nano tube cell array 40, and uses an additional metal layer.

As described above, a memory device using a multiple layer nano tube cell has the following effects: to reduce the whole size of the memory by effectively positioning a multiple layer nano tube cell array and a circuit device region; and to reduce the size of a memory cell by effectively locating a pad array.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device using a multiple layer nano tube cell, comprising:
    a multiple layer nano tube cell array including a plurality of unit nano tube cells arranged in row and column directions;
    a circuit device region for driving the plurality of multiple layer nano tube cell arrays formed on a silicon substrate located under the plurality of multiple layer nano tube cell arrays; and
    an insulating layer, formed between the plurality of multiple layer nano tube cell arrays and the circuit device region, for inter-insulating the plurality of multiple layer nano tube cell arrays and the circuit device region,
    wherein each of the plurality of nano tube cells comprises:
    a capacitor whose one terminal is connected to a word line; and
    a PNPN nano tube switch, which includes at least two or more PNPN diode devices successively connected in series and divided into two groups each connected in parallel between a bit line and the other terminal of the capacitor, for being selectively switched depending on a voltage applied to the word line and the bit line.

2. The memory device according to claim 1, wherein each of the unit nano tube cell further comprises:
   a bit line connected to both nodes of the PNPN nano tube switch through a bit line contact node:
   a contact node connected between a common node connected to at least two or more PNPN diode devices and a bottom electrode of the capacitor; and
   a word line formed on a top electrode capacitor.

3. The memory device according to claim 1, wherein the PNPN nano tube switch is formed on a deposition silicon layer.

4. The memory device according to claim 1, wherein the PNPN nano tube switch comprises:
   a first PNPN diode switch connected forward between the bit line and the bottom electrode of the capacitor; and
   a second PNPN diode switch connected backward between the bit line and the bottom electrode of the capacitor.

5. The memory device according to claim 4, wherein the first PNPN diode switch has an upper P-type region connected to the bottom electrode and a lower N-type region connected to the bit line.

6. The memory device according to claim 4, wherein the second PNPN diode switch has a lower N-type region connected to the bottom electrode and an upper P-type region connected to the bit line.

7. The memory device according to claim 1, wherein each of the plurality of multiple layer nano tube cell arrays comprises:
   a plurality of multiple layer nano tube cells located where a plurality of word lines and a plurality of bit lines arranged in row and column directions are crossed; and
   a plurality of bit line pull-down devices connected one by one to the plurality of bit lines.

8. The memory device according to claim 1, wherein the circuit device region comprises:
   a plurality of word line driving units for selectively driving word lines of the plurality of multiple layer nano tube cell arrays;
   a plurality of sense amplifiers for sensing and amplifying data applied from the plurality of multiple layer nano tube cell arrays;
   a data bus shared by the plurality of sense amplifier;
   a main amplifier for amplifying data applied from the data bus;
   a data buffer for buffering amplification data applied from the main amplifier; and
   an input/output port for externally outputting output data applied from the data buffer or applying externally applied input data to the data buffer.

9. The memory device according to claim 8, wherein each of the plurality of sense amplifiers, which are connected to one by one to a plurality of bit lines, compares and amplifies a reference voltage with a voltage of the bit line when a sense amplifier enable signal is activated.

10. The memory device according to claim 8, wherein the plurality of multiple layer nano tube cell arrays are divided into a plurality of cell array blocks.

11. The memory device according to claim 10, wherein the main amplifier, the data buffer and the input/output port are located in each cell array block.

12. The memory device according to claim 1, further comprising a pad array located in an external region apart from the plurality of multiple layer nano tube cell arrays and the circuit device region.

13. The memory device according to claim 12, wherein the pad array uses the same metal layer as that of the circuit device region.

14. The memory device according to claim 1, further comprising a pad array, which is formed on a metal layer formed on the plurality of multiple layer nano tube cell arrays, for exchanging address and data with the outside.

* * * * *